(12) United States Patent
Ishida

(10) Patent No.: US 6,335,290 B1
(45) Date of Patent: Jan. 1, 2002

(54) ETCHING METHOD, THIN FILM TRANSISTOR MATRIX SUBSTRATE, AND ITS MANUFACTURE

(75) Inventor: Yukimasa Ishida, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/277,791

(22) Filed: Mar. 29, 1999

(30) Foreign Application Priority Data

Jul. 31, 1998 (JP) ............................................ 10-218063

(51) Int. Cl.[7] ..................... H01L 21/302; H01L 21/00; B44C 1/22
(52) U.S. Cl. ..................... 438/705; 438/151; 438/739; 216/62; 216/77; 216/87; 216/102
(58) Field of Search ................... 438/151, 701, 438/713, 738, 739; 216/705 GL, 77, 87, 102

(56) References Cited

U.S. PATENT DOCUMENTS

| | | | | |
|---|---|---|---|---|
| 5,100,768 A | * | 3/1992 | Niki et al. | 430/281 |
| 5,174,816 A | * | 12/1992 | Aoyama et al. | 106/203 |
| 5,517,224 A | * | 5/1996 | Kaizu et al. | 347/59 |
| 5,994,156 A | * | 11/1999 | Voutsas et al. | 438/30 |
| 6,022,751 A | * | 2/2000 | Shindo et al. | 438/21 |

FOREIGN PATENT DOCUMENTS

| | | | |
|---|---|---|---|
| JP | 355166925 A | * | 12/1980 |
| JP | 57-170571 | | 10/1982 |
| JP | 5152326 | | 6/1993 |
| JP | 7-130751 | | 5/1995 |
| JP | 7-235680 | | 9/1995 |
| JP | 9-298202 | | 11/1997 |
| JP | 1051000 | | 2/1998 |

* cited by examiner

Primary Examiner—John F. Niebling
Assistant Examiner—Viktor Simkovic
(74) Attorney, Agent, or Firm—Greer, Burns & Crain, Ltd.

(57) ABSTRACT

In a method of etching an Al or Al alloy layer, an Al or Al alloy layer is formed on an underlying surface, the surface of the Al or Al alloy layer is processed with TMAH, a resist pattern is formed on the surface of the Al or Al alloy layer processed with TMAH, and by using the resist pattern as an etching mask, the Al or Al alloy layer is wet-etched.

20 Claims, 12 Drawing Sheets

ETCHING METHOD, THIN FILM TRANSISTOR MATRIX SUBSTRATE, AND ITS MANUFACTURE

This application is based on Japanese patent application HEI 10-218063 filed on Jul. 31, 1998, the whole contents of which are incorporated herein by reference.

BACKGROUND OF THE INVENTION

1. Field of the Invention

The present invention relates to an etching method, a thin film transistor matrix substrate, and its manufacture method.

2. Description of the Related Art

Wet etching and dry etching are known as etching methods. The wet etching uses liquid as the etchant, and most of this method is accompanied with a property of laterally etching (side etching) a region under the mask. The dry etching uses gas as the etchant, and includes isotropic etching which etches also a region under the mask and anisotropic etching which etches only a region exposed outside the mask generally unidirectionally. Various types of etching methods are selectively used in accordance with an etching purpose.

An active matrix liquid crystal display has a switching display has a switching thin film transistor for each pixel and can hold a desired voltage at a pixel electrode. For example, two groups of bus lines crossing each other are formed on a transparent substrate such as a glass plate, and a pixel having a thin film transistor and a pixel electrode is formed at each cross point. One group of bus lines is connected to the gates of thin film transistors to select pixels of each row. The other group of bus lines transfers image information of one row in the form of voltages to the pixels of a selected row.

In order to hold a desired voltage at the pixel electrode for a sufficiently long time, it is desired that the thin film transistor has excellent off-characteristics of sufficiently low leak current during the off-period. In order to change the voltage of the pixel electrode to a desired voltage in a short time during the rewrite period, it is desired that the thin film transistor has excellent on-characteristics of sufficiently low resistance during the on-period.

Various structures of thin film transistors are known. In the following description, a thin film transistor is assumed to have the structure that a semiconductor layer which forms a channel is formed on a glass substrate, and a gate insulating film and a gate electrode are formed on the semiconductor layer.

An island pattern of a semiconductor layer for forming a thin film transistor is formed on an insulating substrate. On this island pattern, a gate insulating film and a gate layer are deposited. A resist pattern is formed on the gate layer to pattern a gate electrode (and a gate wiring pattern). Thereafter, by using the gate electrode as a mask, ions are implanted into the semiconductor layer. With these processes, a single mask can be used both for patterning the gate electrode and implanting ions.

If the gate insulating film is patterned at the same time when the gate electrode is patterned, the semiconductor layer in an outside area of the gate electrode is exposed so that an ion implantation efficiency can be raised.

However, if the gate electrode layer and gate insulating film are patterned in the same shape, a step becomes high. If the wiring area is made narrow, the gate electrode becomes thicker and the step becomes higher. If an interlayer insulating film and other wiring layers are formed over this high step portion, the step coverage becomes poor so that cracks may easily form in the interlayer insulating film and wiring disconnection and interlayer short circuit are likely to occur.

Techniques of forming a low impurity concentration region of a lightly doped drain (LDD) structure through ion implantation using a gate insulating film projecting sideways from the gate electrode have been proposed. For example, an anodic oxide film is formed on the side walls of a gate electrode, the gate insulating film is etched by using the anodic oxide film as a mask, and ions are implanted into the exposed semiconductor layer to form source/drain regions of a high impurity concetration. After the anodic oxide film is removed, ions are again implanted to form low impurity concentration regions under the projecting gate insulating films.

Also in this case, if the gate electrode layer is thick, a high step is formed so that the step coverage of a higher level wiring layer is degraded. Moreover, as the gate insulating film is etched by using the anodic oxide film of the gate electrode as a mask, deposition of conductive materials is likely to be left on the side walls of the gate insulating film. Such conductive deposition is easy to grow in a needle shape during a later heat treatment or the like so that the step coverage of a higher level wiring layer is degraded.

In order to improve a step coverage of a higher level layer of a lamination structure, it is desired to moderate a step. However, techniques of moderating a step of a thin film transistor formed on an insulating substrate such as a glass substrate have not been sufficiently developed.

In order to reduce leak current during the off-period and to suppress damages of a gate insulating film to be caused by hot carriers during the on-period in a thin film transistor using polycrystalline semiconductor, adopting an LDD structure or an offset structure is desired. However, these structures increase the number of processes. As the number of masks increases, the manufacture cost of a thin film transistor rises.

SUMMARY OF THE INVENTION

It is an object of the present invention to provide an etching method capable of moderating a step.

It is another object of the present invention to provide a method of manufacturing a thin film transistor matrix substrate excellent in step coverage.

It is another object of the present invention to provide a thin film transistor matrix substrate excellent in step coverage and low in a manufacture cost.

According to one aspect of the present invention, there is provided a method of etching an Al or Al alloy layer, comprising the steps of: (a) forming an Al or Al alloy layer on an underlying surface; (b) processing a surface of the Al or Al alloy layer with tetramethylammonium hydroxide (TMAH); (c) forming a resist pattern on the surface of the Al or Al alloy layer processed with TMAH; and (d) by using the resist pattern as an etching mask, wet-etching the Al or Al alloy layer.

As the Al or Al alloy layer processed with TMAH (tetramethylammonium hydroxide) is wet-etched, side walls having a normal or pyramid-like taper are formed. The side walls of a normal taper improve the step coverage of the higher level layer.

According to another aspect of the present invention, there is provided a thin film transistor matrix substrate comprising: an insulating substrate having a flat surface; a plurality of island patterns made of semiconductor and formed on the flat surface of the insulating substrate; a gate insulating film formed traversing a central area, in plan view, of each of the plurality of island patterns; and a gate layer formed on a central surface area of the gate insulating film and exposing a wing of the gate insulating film on both sides thereof, the gate layer having side walls of a normal taper slanted relative to a normal to the flat surface of the insulating substrate and an upper surface generally perpendicular to the normal, and serving as both gate electrode and a gate wiring pattern.

According to another aspect of the present invention, there is provided a method of manufacturing a thin film transistor matrix comprising the steps of: (a) forming a semiconductor layer on an insulating substrate; (b) forming a gate insulating film on the semiconductor layer; (c) forming a gate layer made of Al or Al alloy on the gate insulating film; (d) processing a surface of the gate layer with TMAH; (e) forming a resist pattern on the surface of the gate layer processed with TMAH; (f) by using the resist pattern as an etching mask, wet-etching the gate layer while the gate layer is formed with side walls of a normal taper; and (g) anisotropically dry-etching the gate insulating film by using the resist pattern as an etching mask.

The side walls of a normal taper of the gate layer improve the step coverage of an interlayer insulating film, a wiring layer and the like formed on the gate layer.

By covering the surface of the gate layer with the resist pattern when the gate insulating film is etched, it is possible to prevent deposition of conductive material on the side walls of the gate insulating film.

As above, thin film transistors of an LDD structure can be formed with a small number of masks. Since the step coverage during manufacture process can be improved, a manufacture yield can be improved. TFT transistors having a symmetrical structure can be formed in a self-aligned manner.

DETAILED DESCRIPTION OF THE PREFERRED EMBODIMENTS

If the side wall of a lower level layer in a plurality of laminated layers each having a desired shape has a vertical side wall, the step coverage of a higher level layer is degraded. If the side wall of the lower level layer has a backward or reverse taper, the step coverage of a higher level layer is degraded further. In order to improve the step coverage of a higher level layer, it is effective to make the side wall of the lower level layer pattern have a normal or forward taper. In a multi-layer wiring structure, it is particularly effective if the side wall of a lower level wiring layer has a normal or forward taper.

The present inventor proposes etching technologies of patterning the side wall of a metal layer in a forward taper shape.

FIGS. 1A to 1D are schematic cross sectional views of a substrate illustrating a method of etching a metal layer according to a first embodiment of the invention.

Figure 1A:
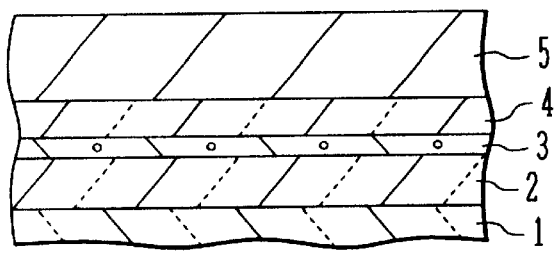
FIGS. 1A to 1D are cross sectional views of a substrate illustrating an etching method according to an embodiment of the invention.

As shown in FIG. 1A, on the flat surface of a glass substrate 1, an $SiO_2$ layer 2 was deposited to a thickness of about 200 nm by plasma enhanced (PE) chemical vapor deposition (CVD) at a substrate temperature of about 300°, the $SiO_2$ layer preventing impurities in the glass from being mixed with materials of other layers to be formed on the $SiO_2$ layer. On this $SiO_2$ layer 2, an amorphous Si layer 3 was deposited to a thickness of about 50 nm by CVD. Laser annealing was performed for the amorphous Si layer 3 to change it to a polysilicon layer 3. On the polysilicon layer 3, an $SiO_2$ layer 4 was deposited to a thickness of about 120 nm at a substrate temperature of about 300° through PECVD. On the $SiO_2$ layer 4, a metal layer 5 made of Al or Al alloy was deposited to a thickness of about 300 nm through sputtering. As the Al alloy, an Al alloy containing Nd or Sc was used. Although the following description will be made on the case when the metal layer 5 has a thickness of about 300 nm, samples having the metal layer 5 of 200 to 400 nm in thickness presented similar experimental results as given in the following.

The structure shown in FIG. 1A corresponds to a structure of a thin film transistor (TFT) on a glass substrate having a semiconductor layer and a gate electrode layer.

Figure 1B:
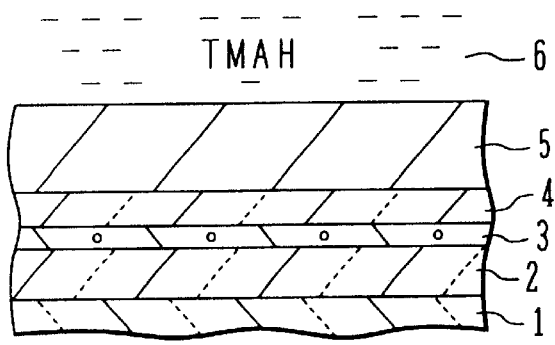

As shown in FIG. 1B, aqueous solution 6 of 2.2% tetramethylammonium hydroxide (TMAH) was prepared. The substrate was dipped in the TMAH aqueous solution 6 for about 60 seconds. Thereafter, the substrate was washed with pure water and the surface of the metal layer 5 was dried.

Figure 1C:
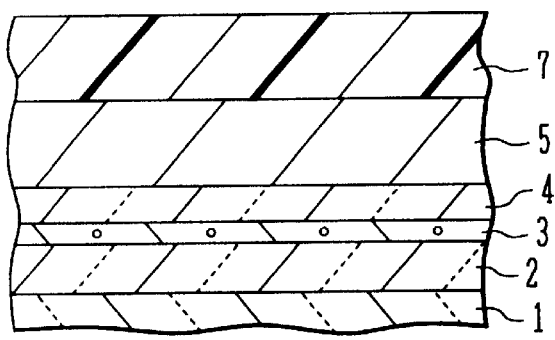

As shown in FIG. 1C, a resist layer 7 was coated on the surface of the metal layer 5. After the resist layer 7 was coated, it was prebaked at 110° C., selectively exposed and developed. After the exposure and development, the substrate was heated to postbake the resist pattern.

Figure 1D:
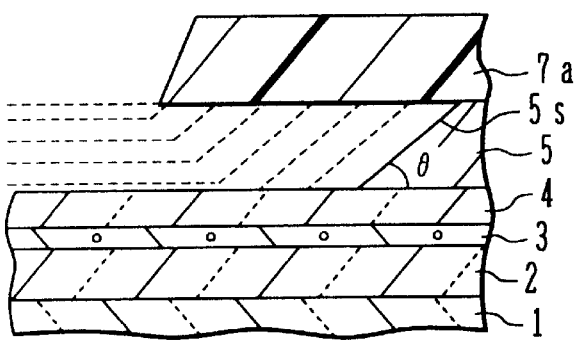

As shown in FIG. 1D, by using as an etching mask the resist pattern 7a formed in the above manner, the underlying metal layer 5 was wet-etched by using, as an etchant, aqueous solution which contains phosphoric acid, nitric acid, and acetic acid. The gradually changing surfaces of the metal layer 5 etched are shown time-sequentially by broken lines in FIG. 1D. The side wall 5s of the metal layer 5 has a constant forward or normal taper angle relative to the surface of an underlying layer, and creeps under the resist pattern at a constant speed generally in proportion with an etching time. The experimental results will be described with reference to graphs.

Figure 2A:
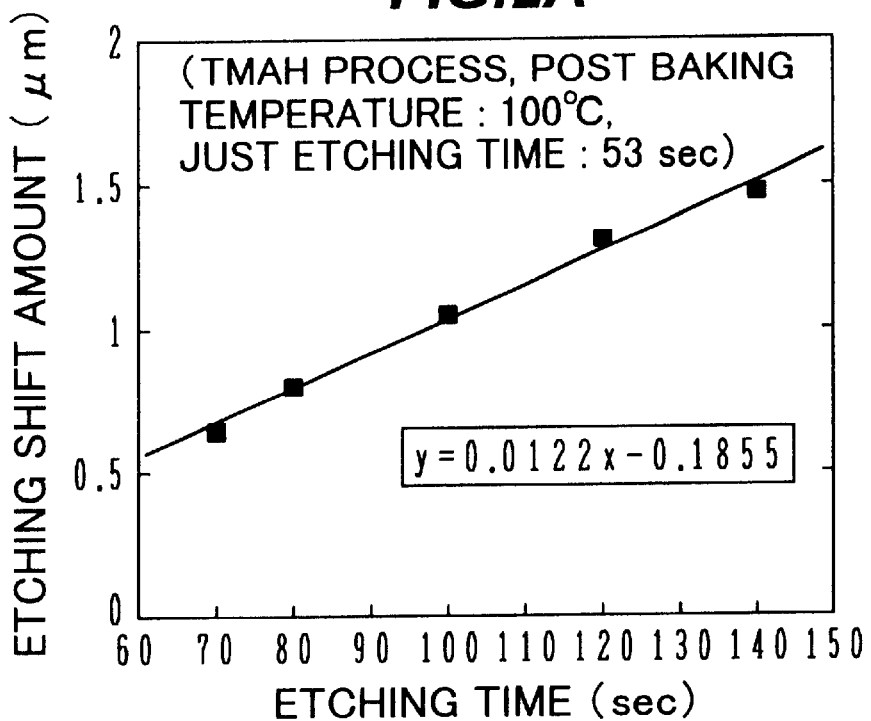
FIGS. 2A and 2B are graphs showing experimental results using the embodiment method illustrated in FIGS. 1A to 1D.
Figure 2B:
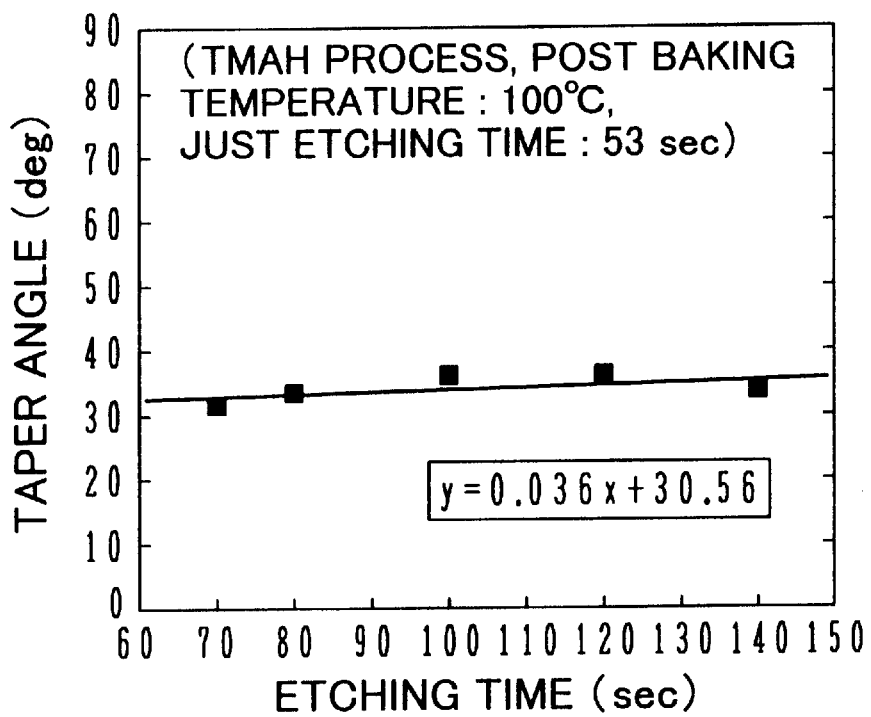

The graphs of FIGS. 2A and 2B show the etching shift amount and taper angle as functions of the etching time. The whole thickness of the metal layer 5 was just etched in 53 seconds in a wide area without mask. Etching after just-etching is called after etching which enhances side etching. The etching shift amount is a distance from the end of the resist pattern 7a shown in FIG. 1D to the etched side wall surface. The taper angle is an angle θ between the surface of the underlying layer 4 and the side wall 5s of the metal layer 5. The experimental results shown in FIGS. 2A and 2B were obtained at the postbaking temperature of 100° C. and at the etching time in a range from 70 seconds to 140 seconds.

As seen from the graph of FIG. 2A, the etching shift amount changes linearly with the etching time. It is therefore possible to correctly control the side wall position of the etched metal layer by the etching time.

As seen from the graph of FIG. 2B, the taper angle does not depend much upon the etching time, but maintains generally a constant value. The taper angle is approximately 35° at the postbaking temperature of 100° C. There is a tendency that the taper angle increases slightly during an initial short period of the etching time. However, during a period of the etching time longer than about 100 seconds, the taper angle takes almost a constant value. These experimental results indicate that a desired taper angle can be obtained independently from the etching time.

The taper angle can be changed by changing the temperature of the postbaking after the exposure and development of the resist layer.

Figure 3:
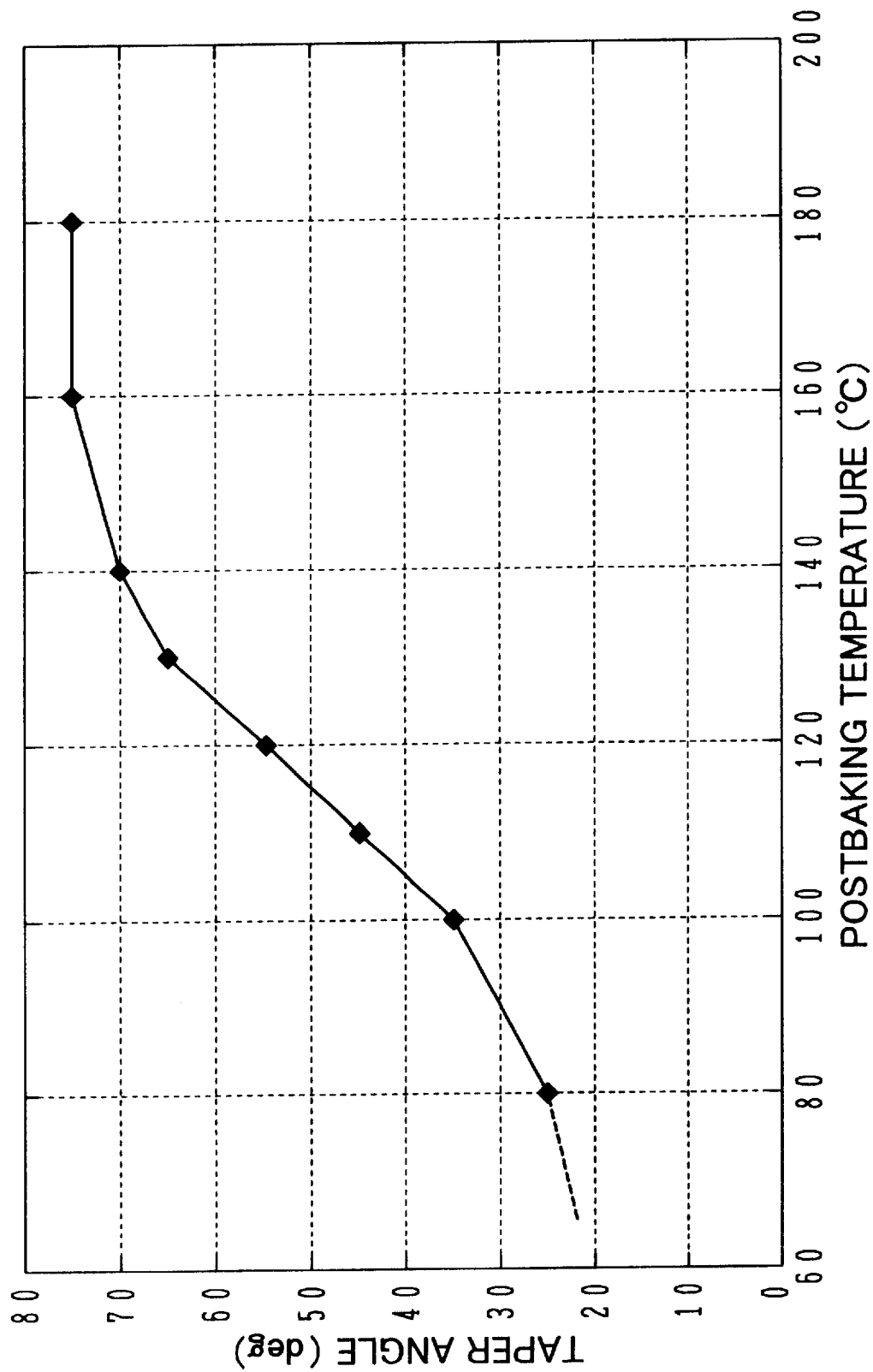
FIG. 3 is a graph showing experimental results using the embodiment method illustrated in FIGS. 1A to 1D.

FIG. 3 is a graph showing a change in the taper angle relative to the postbaking temperature. The taper angle of about 35° at the postbaking temperature of 100° C. shown in FIG. 2B becomes smaller as the postbaking temperature is lowered. As the postbaking temperature is raised, the taper angle becomes larger. The taper angle of about 70° is obtained at the postbaking temperature of 140° C. At the postbaking temperature of 140° C. or higher, a change in the taper angle becomes gradually small.

Although the postbaking temperature lower than 60° C. is not shown in FIGS. 2A and 2B and FIG. 3, the taper angle becomes small at a lower temperature. For example, at the postbaking temperature of approximately the room temperature, the taper angle is about 15°. As seen from FIG. 3, the taper angle from about 20° to about 70° can be obtained at the postbaking temperature from about 60° C. to about 140° C.

In the characteristic curve shown in FIG. 3, a characteristic isotropic point was obtained at the postbaking temperature of about 120° C. which presented the taper angle of about 55°. If the postbaking temperature higher than the isotropic point is used, the taper angle becomes large. However, in this case, if the etching is performed for a long time, an overhang is likely to be formed at the upper portion of the metal layer side wall. In order to avoid the overhang, the etching amount is therefore required to be limited. If the etching amount is small, there is no practical problem in obtaining a desired taper angle.

At the postbaking temperature lower than the isotropic point, an overhang will not be formed and a predetermined constant taper angle can be obtained even if how long the etching is performed is in the time range capable of etching reaction.

As above, by processing the Al or Al alloy layer surface with TMAH before the resist is coated, a constant forward taper angle of the side wall can be obtained. In addition, by changing the postbaking temperature after the exposure and development, a desired taper angle can be set.

The present inventor has made a study of the reason why a constant forward taper side wall is obtained through wet etching of the TMAH processed Al or Al alloy layer.

Al has a chemically active surface and is likely to form a natural oxide film or natural hydrated film. TMAH has a capability of removing the natural oxide film or natural hydrated film. If a chemically changed film such as a natural oxide film or a natural hydrated film is formed on the surface of Al or Al alloy, the etching rate becomes slow.

During the side etching creeping under the resist pattern, the etching rate at the chemically changed surface of Al or Al alloy becomes slow. Therefore, the side wall initially having the forward taper surface gradually retracts in the surface region and forms an overhang. In contrast, if the chemically changed film on the surface of Al or Al alloy is removed, the whole of the metal layer is etched at a constant etching rate and a constant taper angle is obtained independently from the etching time.

If the above study is proper, it can be expected that side etching (taper etching) providing a constant forward taper angle becomes possible by removing the chemically changed layer on the Al or Al alloy surface. Chemicals having a capability of removing a natural oxide film or natural hydrated film on the Al or Al alloy surface include: in addition to TMAH, choline; ethylenediaminetetraacetato (ethylenediaminetetraacetic acid, EDTA); diluted hydrofluoric acid aqueous solution which contains ethylene glycol and surface-active agent; and the like. It can be expected that by using these chemicals, the side wall having a forward taper surface can be obtained through side etching of the Al or Al alloy layer.

Although it is not proper if this process damages the underlying Al or Al alloy layer, these chemicals will not damage the Al or Al alloy layer.

The dipping time in the TMAH aqueous solution was about 60 seconds. The slight etching amount of the chemically changed Al surface layer is about 10 nm for 2.2% TMAH aqueous solution at 25° C.

A thickness of a surface oxide film or surface hydrated film is in the range from 5 to 15 nm according to optical measurement. It can be considered from this that a sufficient forward taper angle effect can be obtained without removing the whole of the chemically changed surface layer. In this specification, therefore, a process of "removing" a chemically changed surface layer may be a process of removing at least a portion of the chemically changed surface layer. An embodiment utilizing the effects confirmed by the above experiments will be described.

Figure 4A:
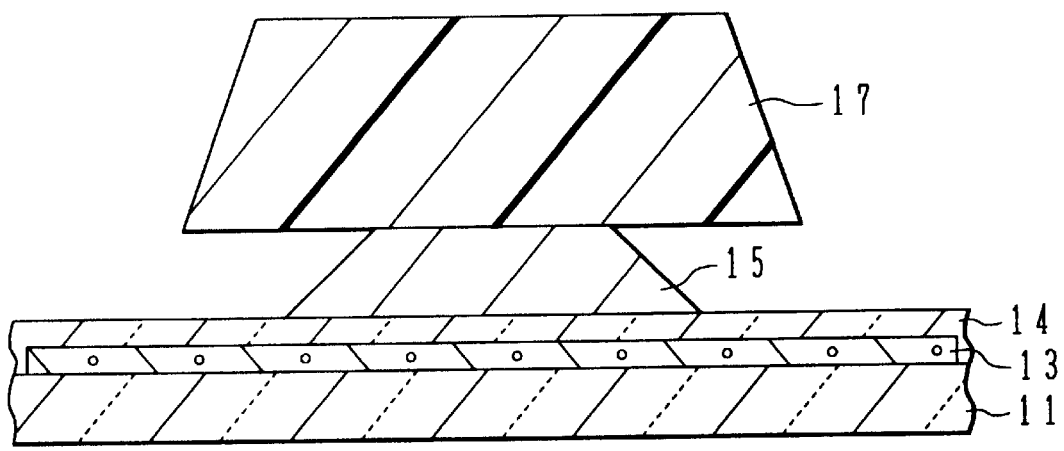
FIGS. 4A to 4C are cross sectional views of a substrate illustrating a TFT manufacture method according to an embodiment of the invention.
Figure 4B:
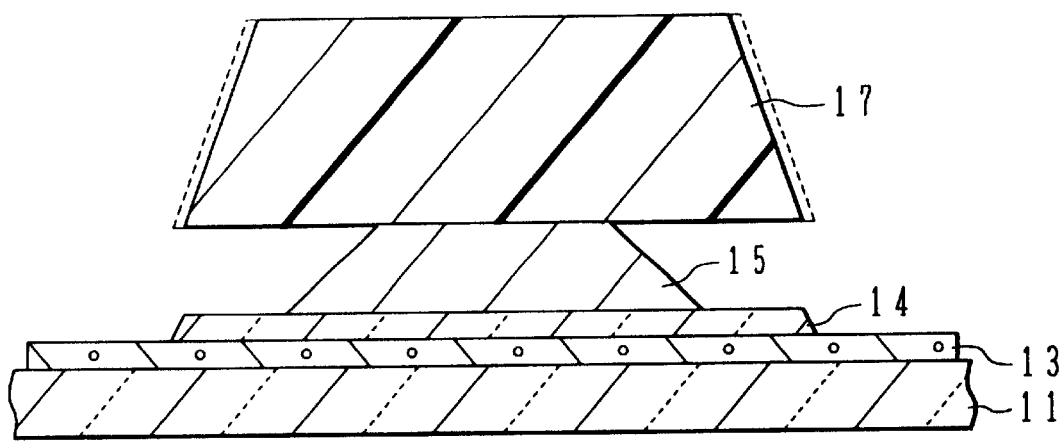
Figure 4C:
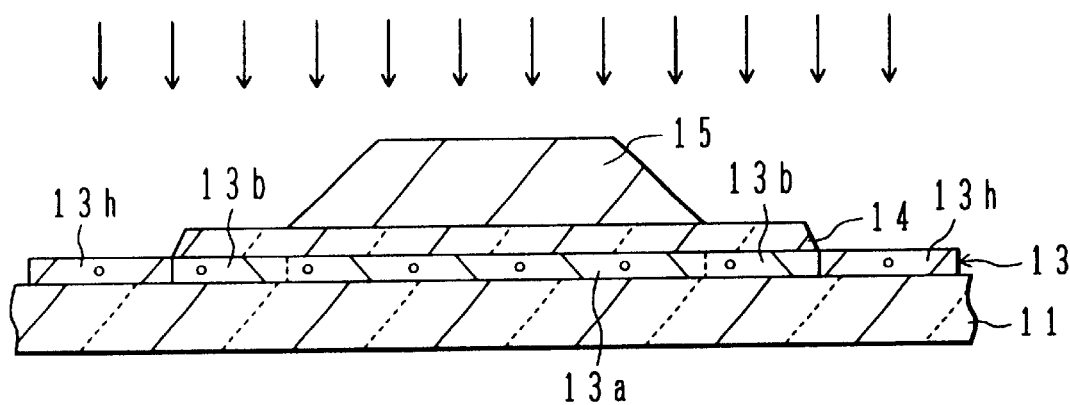

FIGS. 4A to 4C are cross sectional views of a substrate illustrating a method of manufacturing a thin film transistor according to an embodiment of the invention.

As shown in FIG. 4A, on the surface of an insulating substrate 11 which is a glass substrate formed with an $SiO_2$ layer, a semiconductor layer 13 made of polysilicon is formed by CVD and laser annealing. After the semiconductor layer 13 is formed, a resist pattern is formed on the semiconductor layer 13 to etch the semiconductor layer and form a semiconductor layer 13 comprising a plurality of separated islands.

An $SiO_2$ layer 14 to be used as the gate insulating film is deposited through PECVD, covering the semiconductor layer 13. On the surface of the gate insulating film 14, a gate layer 15 of Al or Al alloy is deposited through sputtering. The Al alloy of the gate layer 15 may be Al alloy containing Nd, Si, Mo, W, B, Ti, Ta, Zr, Y, Sc, or a combination thereof. For example, Al alloy containing 2 at % to 4 at % of Nd may be used.

After the gate layer 15 is deposited, the surface of the gate layer 15 is processed with TMAH aqueous solution. This TMAH aqueous solution process may be performed in a manner similar to the TMAH process described with reference to FIG. 1B.

A resist pattern 17 is formed on the gate layer 15 by coating a resist layer, exposing and developing it. The resist pattern 17 has preferably a tapered side wall expanding downward as shown in FIG. 4A.

After the resist pattern 17 is formed, the substrate is heated to postbake the resist pattern. The postbaking temperature is selected so as to obtain a desired taper angle during the wet etching of the gate layer 15. For example, the postbaking is performed at a temperature in a range of 60° C. to 140° C. or more preferably at a temperature in a range of 60° C. to 120° C. to obtain the taper angle of 20° to 70° or more preferably the taper angle of 20° to 55°.

By using the resist pattern 17 as an etching mask, the underlying gate layer 15 is wet-etched by using, as an etchant, aqueous solution containing phosphoric acid, nitric acid, and acetic acid.

After the whole thickness of the gate layer 15 in an area where it is not covered with the resist pattern 17 is etched, an over-etching of about 50% or more is further performed. During this over-etching, the gate layer 15 under the outer peripheral area of the resist pattern 17 is side-etched while a constant forward taper angle is maintained. With this side-etching, the side wall of the gate layer 15 moves inward while the constant taper angle of the side wall is maintained.

As shown in FIG. 4B, after the gate layer 15 is wet-etched, the gate insulating film 14 is anisotropically etched through reactive ion etching (RIE), by using the same resist pattern 17. In this case, if the resist pattern 17 has a tapered side wall as shown in FIG. 4B, as the resist pattern 17 is consumed, the side wall thereof is retracted and the side wall of the gate insulating film 14 also has a taper angle. In this manner, the gate insulating film 14 is etched to have a side wall with a taper angle of 40° to 80°. Thereafter, the resist pattern 17 is removed with remover or the like.

As shown in FIG. 4C, impurity ions such as P are doped from an upper position down into the semiconductor layer 12 through ion implantation. An acceleration energy of ion implantation is selected so as not to make ions pass through the gate insulating film 14. The impurity ions are implanted only in the exposed semiconductor layer 13 to form high impurity concentration regions 13h. A region 13a over which the gate electrode 15 is formed becomes the channel region. Regions 13b between the channel region 13a and high impurity concentration regions 13h are not doped with ions and become offset regions separating the channel region from the high impurity concentration regions to ensure the off-characteristics of this thin film transistor.

The thin film transistor shown in FIG. 4C reduces leak current during the off-period. However, it has a possibility of increasing a resistance during the on-period because there exist the offset regions. If the offset regions are changed to LDD regions having a low impurity concentration, the on-characteristics can be improved.

Figure 5A:
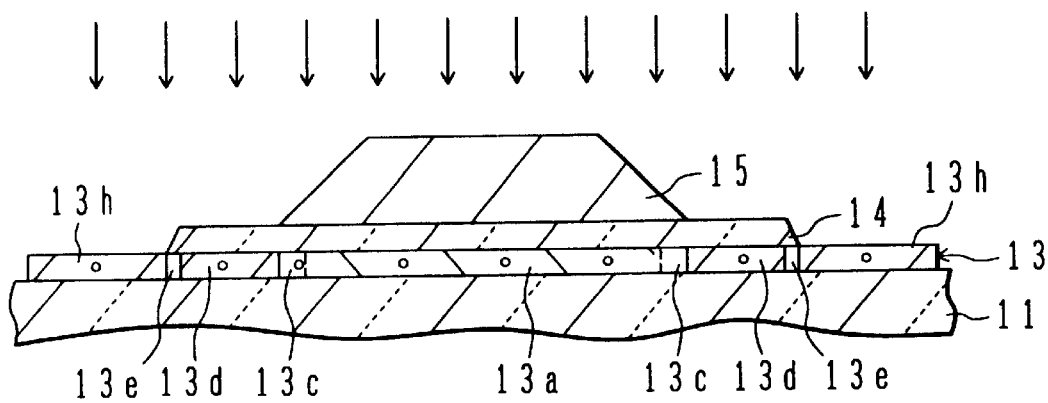
FIGS. 5A to 5C are cross sectional views of a substrate and a graph, illustrating a TFT manufacture method according to another embodiment of the invention.
Figure 5B:
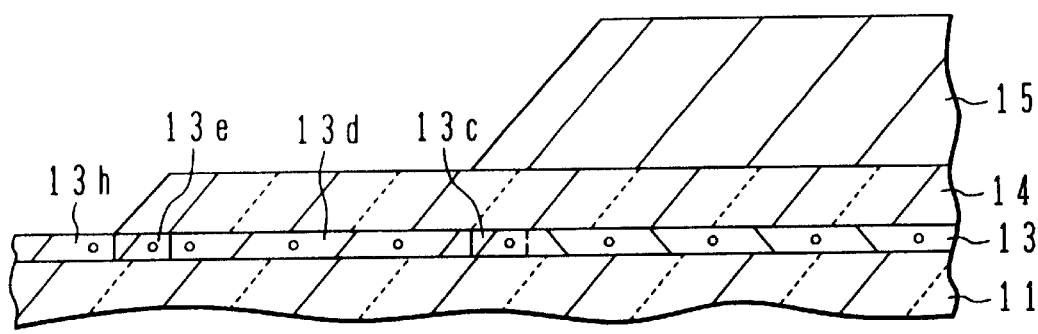
Figure 5C:
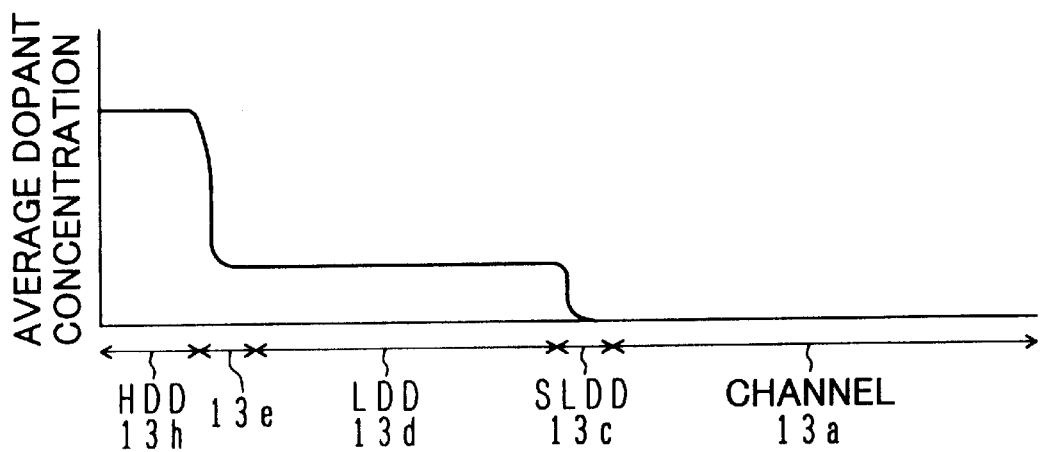

FIGS. 5A to 5C are cross sectional views of a substrate illustrating a manufacture method of a thin film transistor according to another embodiment of the invention and showing the structure of the manufactured thin film transistor, and a graph showing an impurity concentration distribution.

In the doping process shown in FIG. 4C, ions are implanted at an acceleration energy which does not allow the ions to pass through the gate insulating film.

In a process shown in FIG. 5A, ion implantation not allowing ions to pass through the gate insulating film 14 and ion implantation allowing ions to be doped into the semiconductor layer 13 also through the gate insulating film 12 are performed in succession. For example, bare doping for implanting ions only into a region where the semiconductor layer 13 is exposed is performed at an acceleration energy of 10 keV and a dose of $7.5 \times 10^{14}$ cm$^{-2}$, and through doping for implanting ions into the semiconductor layer 13 via the gate insulating film and into the bare exposed semiconductor layer is performed at an acceleration energy of 70 keV and a dose of $1 \times 10^{14}$ cm$^{-2}$.

For example, the impurity concentration by the bare doping is $7.5 \times 10^{19}$ cm$^{-3}$, and the impurity concentration by the through doping is $1 \times 10^{19}$ cm$^{-3}$. With the above processes, low impurity concentration regions (LDD regions) 13d are formed in opposite regions next to the channel region 13a and high impurity concentration regions (HDD regions) 13h are formed in both outer sides of the LDD regions 13d.

Impurity concentration gradient regions 13c gradually changing their impurity concentration are formed between the channel region 13a and LDD regions 13d, and impurity concentration gradient regions 13e gradually changing their impurity concentration are formed between the LDD regions 13d and HDD regions 13h.

FIG. 5B is an enlarged cross sectional view showing a region where the impurity concentration gradient regions are formed. FIG. 5C is a graph showing an impurity concentration distribution in the thin film transistor shown in FIG. 5B. The gate insulating film 14 and gate electrode 15 have side walls with a taper angle. Therefore, the ion implantation efficiency of the semiconductor layer 13 changes gradually in these tapered areas.

The outermost high impurity concentration (HDD) regions 13h are formed in the areas where the semiconductor layer 13 is exposed and ions of both the bare and through doping are directly implanted. A region 13e adjacent to the HDD region 13h and having the slanted side wall of the gate insulating film 14 gradually changes its impurity concentration from that in the high impurity concentration region 13h to that in the low impurity concentration region 13d.

The thickness of the gate electrode 15 becomes gradually larger inward along the slanted side wall. If the ion implantation acceleration energy has a level allowing ions to pass through the gate insulating film 14, impurity ions are implanted into the semiconductor layer 13 via the relatively thin gate electrode 15 and gate insulating film 14. As the gate electrode 15 increases its thickness, the impurity ion concentration in the semiconductor layer 13 lowers. In this manner, the super low impurity concentration region (SLDD) 13c gradually lowering its impurity concentration is formed between the low impurity concentration (LDD) region 13d and channel region 13a.

Such an impurity concentration distribution alleviates an electric field concentration when a depletion layer is formed in the semiconductor layer 13. The lower the impurity concentration of the LDD region 13d, the more effective for the prevention of electric field concentration. However, if the impurity concentration is lowered too much, the resistance in the on-period increases. In order to reduce the on-resistance lower than a certain value, it is desired that the impurity concentration is set to a certain level or higher. In such a case, if the impurity concentration distribution is changed sharply, an electric field concentration is likely to occur in the region where the impurity concentration changes sharply.

By forming the SLDD regions 13c, it becomes easy to prevent the on-resistance from being increased because the LDD regions exist, while the electric field concentration is avoided.

If the gate electrode 15 and gate insulating film 14 have a slanted side wall, the step coverage of an interlayer insulating film and a higher level wiring layer formed on the gate electrode and gate insulating film can be improved.

Figure 6A:
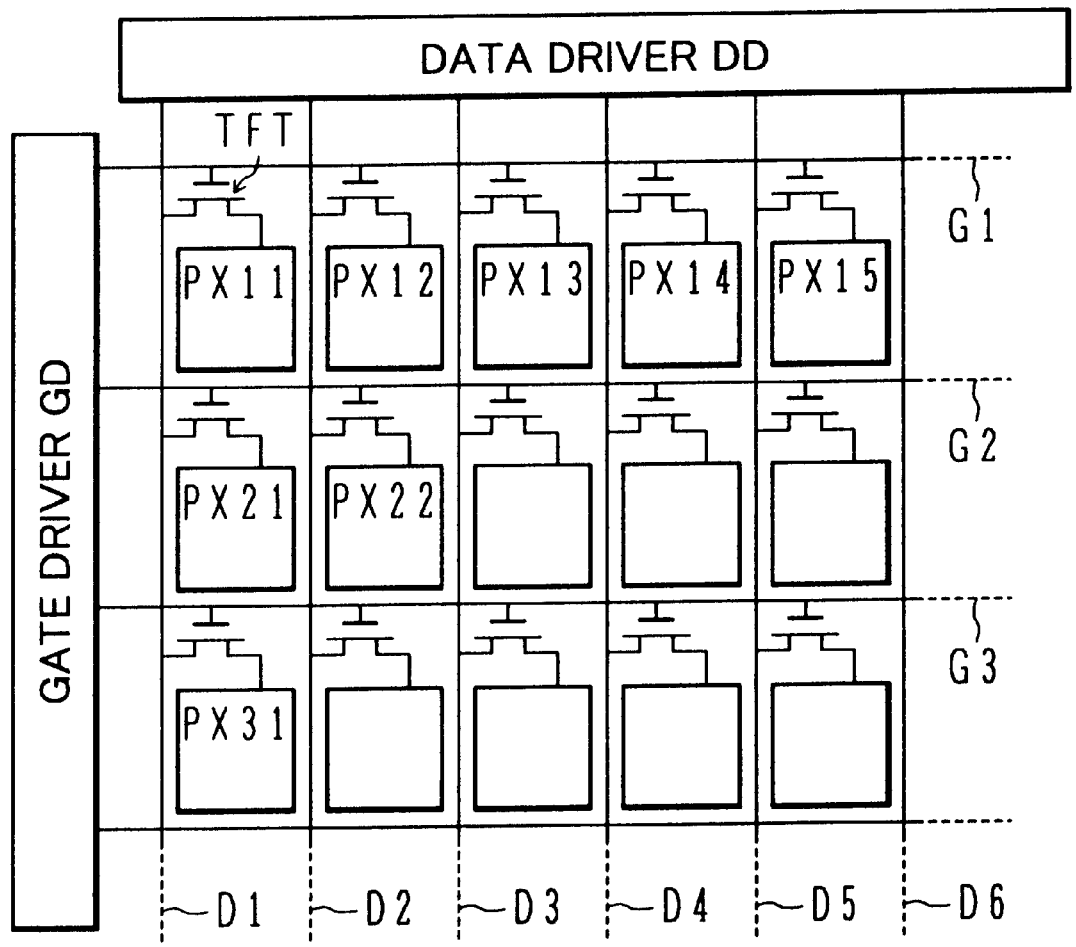
FIGS. 6A and 6B are a schematic plan view and a partial equivalent circuit of an active circuit formed on a glass substrate of a liquid crystal display.

FIG. 6A is a schematic plan view of a thin film transistor matrix of a liquid crystal display. Pixel electrodes PX are disposed in a matrix configuration in a display area. Along the highest row, pixel electrodes PX11, PX12, . . . are disposed in line to form the first row of the pixel matrix. Pixel electrodes PX21, PX31, . . . are disposed under the pixel electrode PX11 to form a first column of the pixel matrix. In a similar manner, pixel electrodes PX are disposed in the matrix form to constitute a display plane.

A thin film transistor (TFT) is connected to each pixel electrode. Gate electrodes of TFT's are connected to corresponding gate wiring lines G1, G2, . . . disposed in the horizontal direction, the gate wiring lines G1, G2, . . . being controlled by a gate driver GD. Drain electrodes of TFT's are connected to corresponding drain wiring lines D1, D2, . . . disposed in the vertical direction, the drain wiring lines D1, D2, . . . being controlled by a data driver DD.

The data driver DD receives pixel information of one row and generates corresponding voltages. The transistors of one row connected to the gate wiring line G selected by the gate driver GD are turned on and the voltages representative of the image information of one row supplied from the data driver DD are applied to the relected one pixel row.

After the image information is stored in the pixel electrodes PX, the thin film transistors TFT are turned off to hold the voltages at the pixel electrodes.

Figure 6B:
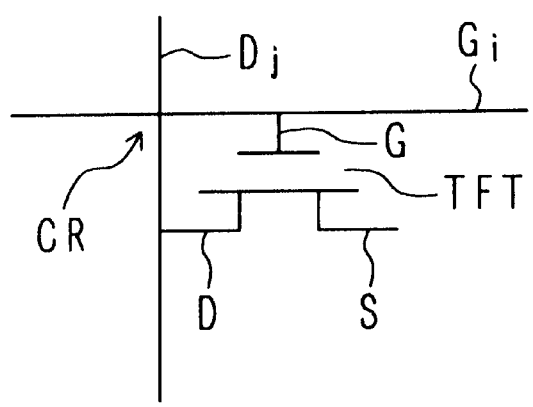

FIG. 6B is a schematic diagram showing a configuration of a thin film transistor TFT, a gate wiring line Gi, and a drain wiring line Dj constituting one pixel. The gate wiring line Gi and drain wiring line Dj define each cross area. In order to form wiring lines crossing each other, a multi-layer wiring structure is necessary. If a wiring layer having a tapered side wall described with the above embodiment is used as the gate wiring line Gi as the lower level wiring line of the multi-layer wiring structure, the step coverage of the drain wiring line as the higher level wiring line can be improved.

Figure 7A:
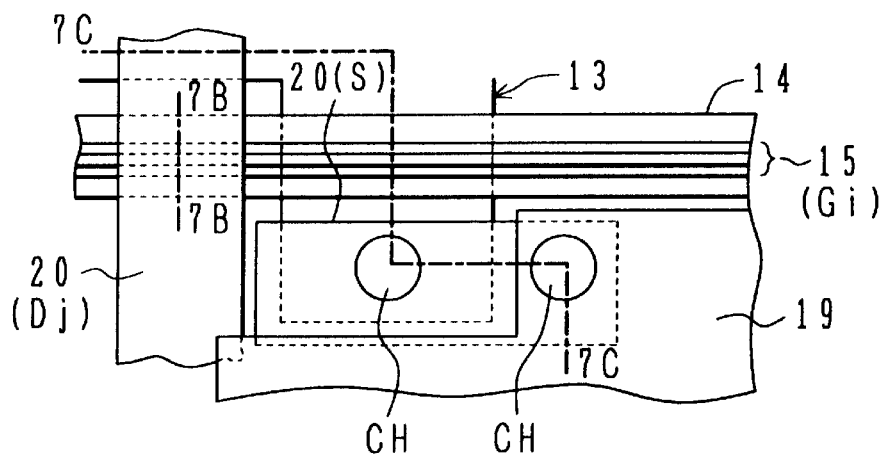
FIGS. 7A to 7C are a plan view and cross sectional views showing the structure of a semiconductor device manufactured by a semiconductor device manufacture method according to the embodiment of the invention.
Figure 7B:
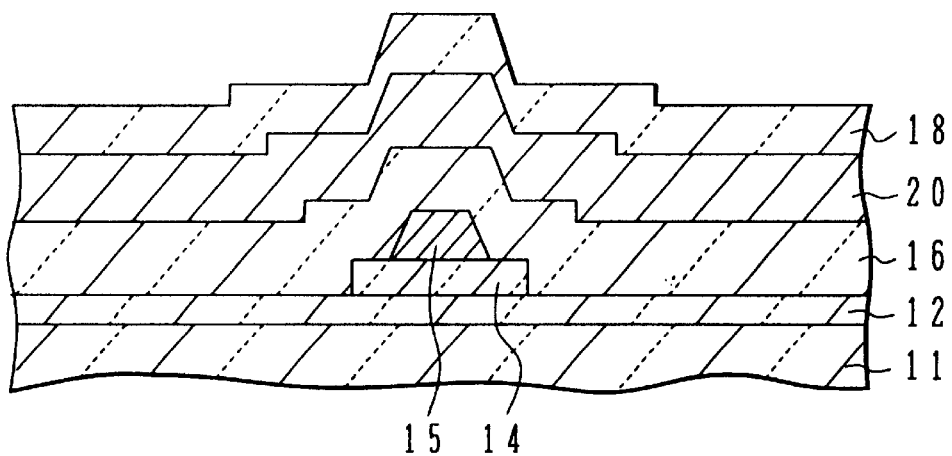
Figure 7C:
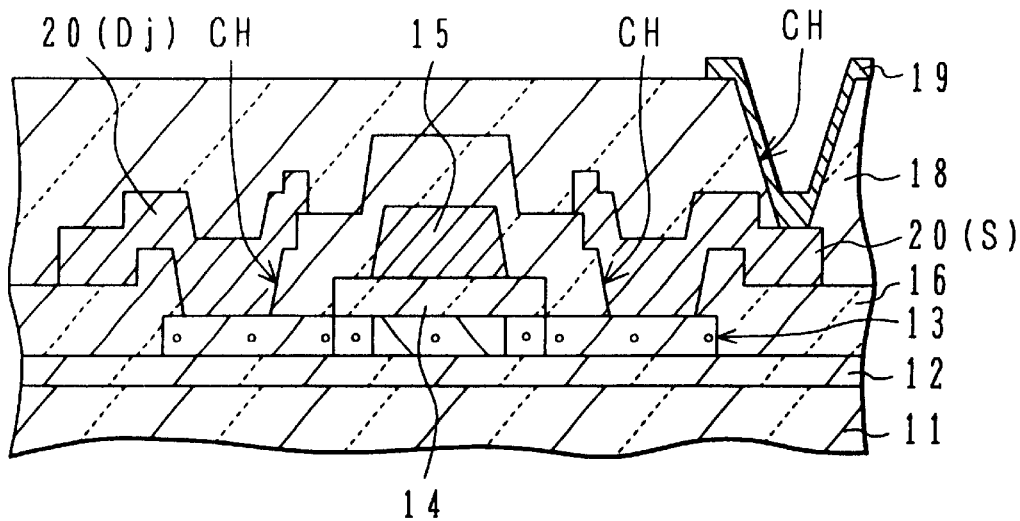

FIGS. 7A to 7C are schematic diagrams showing the structure of a thin film transistor using wiring layers with a taper angle of the above embodiment as the gate electrode and gate wiring layer.

Referring to FIG. 7A, a gate wiring line 15 extends in the horizontal direction and has a flat upper surface and opposite slanted side walls. On both sides of the gate wiring line 15, a gate insulating film 14 extends like a wing. In FIG. 7A, the slanted side wall of the gate insulating film 14 is not shown and omitted.

A metal pattern 20 constituting a drain wiring line Dj is disposed over the gate wiring line 15, with an interlayer insulating film 16 being interposed therebetween. Since the gate wiring line 15 has the slanted side walls, the step coverage of the interlayer insulating film 16 and drain wiring line 20 is improved. At the same time when the drain wiring line Dj is formed, a wiring area (source wiring area) 20(S) is formed to connect the source region of the thin film transistor TFT to the pixel electrode. An interlayer insulating film 18 is formed on this wiring area 20S and an ITO film 19 constituting the pixel electrode is formed on the inter- layer insulating film 18. Electrical connection is established via contact holes CH between the pixel electrode 19 and source wiring area 20(S) and between the source wiring area 20(S) and source region of the semiconductor layer 13.

FIGS. 7B and 7C are cross sectional views of the thin film transistor constructed as above, respectively taken along broken lines 7B—7B and 7C—7C in FIG. 7A.

FIG. 7B shows a cross sectional structure in a region where the gate wiring line and drain wiring line cross each other. On the flat surface of a glass substrate 11, an $SiO_2$ layer 12 is formed, and on this $SiO_2$ layer, the striped gate insulating film 14 is formed. On the gate insulating film 14, the gate wiring line 15 is formed having the tapered side walls. Even if the gate wiring line 15 becomes thick, the step coverage of the interlayer insulating film 16 formed thereon is improved because the gate wiring line 15 has the tapered side walls. Therefore, the step coverage of the drain wiring line 20 formed on the interlayer insulating film 16 and that of the interlayer insulating film 18 formed over the interlayer insulating film 20 are also improved.

FIG. 7C shows a cross sectional structure in the connection areas between the drain wiring line and thin film transistor and between the pixel electrode and thin film transistor. On the flat surface of the glass substrate 11, the $SiO_2$ layer 12 is formed, and on the $SiO_2$ layer 12, an island pattern 13 of the semiconductor layer 13 forming the thin film transistor is formed. The gate insulating film 14 is formed on the central area of the island pattern of the semiconductor layer 13, and on the central area of the gate insulating film 14, the gate wiring line 15 is formed.

Since the gate wiring line 15 has the tapered side walls, the step coverage of the interlayer insulating film 16 formed on the gate wiring line 15 is improved. The contact holes CH are formed through the interlayer insulating film 16. The source/drain wiring lines 20(S) and 20(Dj) are formed on the interlayer insulating film and electrically connected via the contact holes CH to the source/drain regions of the semiconductor layer 13. The interlayer insulating film 18 is formed over the source/drain wiring lines 20(S) and 20(Dj), and the contact hole CH is formed through the interlayer insulating film 18 in the area corresponding to the pixel electrode. The ITO film is formed on the interlayer insulating film 18 and connected to the source wiring line 20(S).

For example, the semiconductor layer 13 has a thickness of 15 to 70 nm. The gate insulating film 14 has a thickness of 50 to 200 nm. The gate electrode 15 on the gate insulating film 14 has a thickness of 100 to 800 nm. Even if the gate electrode 15 becomes thick, if its side walls have a taper angle, the step coverage of the interlayer insulating film 16 formed thereon is improved.

The wing region of the gate insulating film extending outside on opposite sides of the gate electrode 15 has a width of 0.1 to 2.0 μm, or more preferably a width of 0.7 to 1 μm. The tapered side wall of the gate electrode 15 has an angle of 20 to 700 or more preferably an angle of 20 to 55°, relative to the flat upper surface of the gate insulating film 14.

In the above embodiment, after the Al or Al alloy layer was deposited, the surface of this layer was processed with TMAH solution or chemicals capable of removing a natural (or native) oxide film or natural (or native) hydrated film. Other methods may be used to expect similar effects.

Figure 8A:
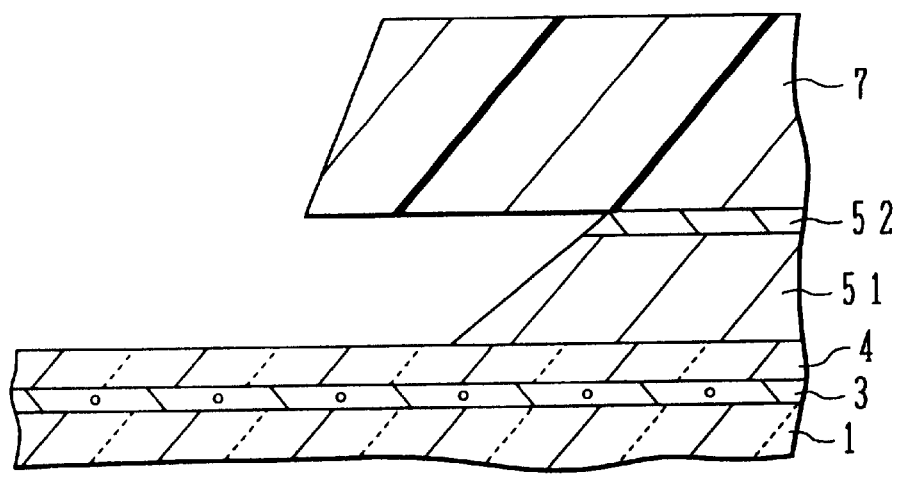
FIGS. 8A to 8C are cross sectional views of a substrate illustrating etching methods according to other embodiments of the invention.
Figure 8B:
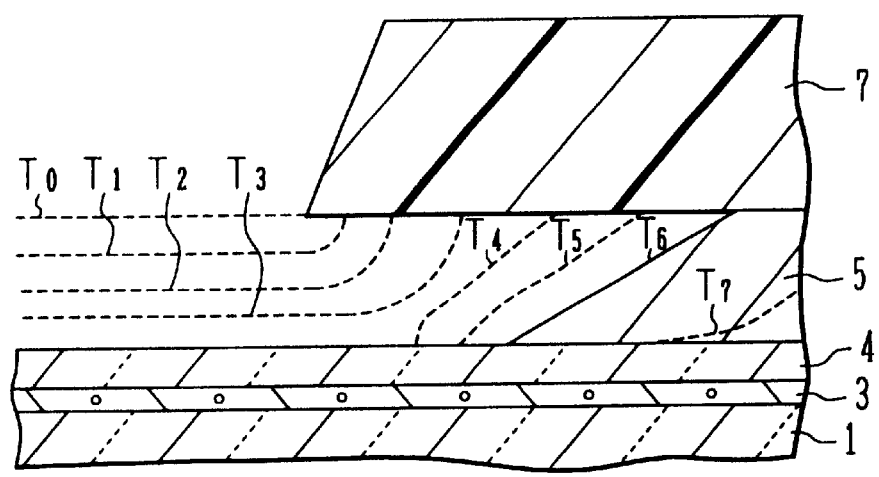

FIGS. 8A and 8B illustrate other etching methods capable of forming a forward taper angle.

Referring to FIG. 8A, after a semiconductor layer 3 is formed on the surface of an insulating substrate 1, the semiconductor layer 3 may be patterned if necessary. An insulating layer 4 is formed covering the semiconductor layer 3. An Al (Al alloy) layer 51 is deposited on the insulating layer 4. A Ti layer 52 is deposited on the surface of the Al (Al alloy) layer 51. Ti has a higher etching rate than Al, for example, if solution containing hydrofluoric acid is used.

A resist pattern 7 is formed on the Ti layer 52, and the Ti layer 52 and Al layer 51 are patterned by etching using the resist pattern 7 as an etching mask. In this case, since the etching rate of the Ti layer 52 is faster than that of the Al layer 51, etching of the Ti layer 52 proceeds with a priority over the Al layer 51. Therefore, etching the lamination structure of the lower Al layer 51 and upper Ti layer proceeds while the forward taper angle is maintained.

FIG. 8B illustrates another method of realizing the forward taper angle by using ordinary etching. After a semiconductor layer 3 and an insulating film 4 are formed on an insulating substrate 1, an Al (Al alloy) layer 5 is deposited. A resist pattern 7 is formed on the Al layer 5. The Al layer 5 is etched by using the resist pattern 7 as an etching mask. This etching proceeds with time as indicated by T0, T1, T2, T3, . . . As the etching continous for a long time, the side walls indicated by T7 is formed and an overhang is likely to be formed at the upper portion of this side wall. However, at the preceeding stage, the forward tapered side wall indicated by T6 is formed. Therefore, by properly selecting this timing, a pattern having a forward taper side wall can be formed.

A side wall etched and slanted in two steps may also be formed.

Figure 8C:
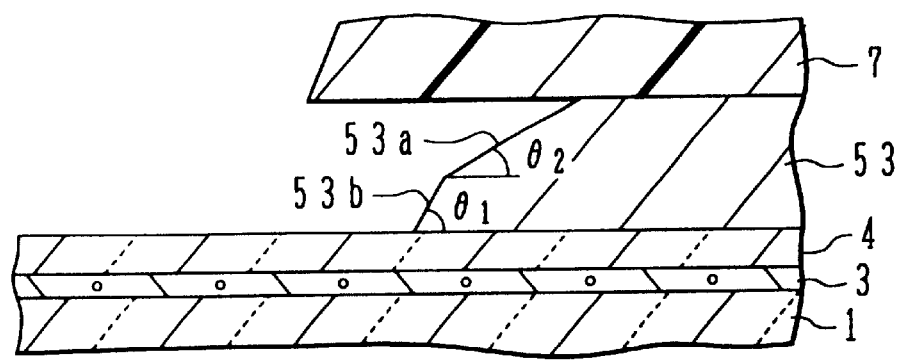

FIG. 8C illustrates an etching method capable of making an etched side wall slanted in two steps. Similar to FIG. 8B, a semiconductor layer 3, an insulating layer 4, and an Al (Al alloy) layer 53 are formed over an insulating substrate 1. A resist pattern 7 is formed on the Al layer 53 to perform wet etching by using the resist pattern 7 as an etching mask. As an etchant, a solution containing $H_3PO_4$, $HNO_3$, $CH_3COOH$, and $H_2O$ is used. More preferably, the solution contains 5 wt % or more of $HNO_3$.

As the Al layer 53 is etched with this etchant, reaction gasses such as $N_2$ and $H_2$ are generated during etching. Some of the reaction gasses rises in the etchant in the form of bubbles, and the other of the reaction gasses creeps and becomes resident under the resist pattern 7 in the form of bubbles. The reaction gasses resident under the resist pattern 7 push up the outer portion of the resist pattern 7 which is therefore spaced from the Al layer 53. A gap is therefore formed between the outer portion of the resist pattern 7 and Al layer 53 so that the etchant becomes easy to reach the surface of the Al layer 53 under the resist pattern 7.

Therefore, a side wall upper portion 53a of the etched Al layer has a smaller taper angle θ2 relative to the underlying surface. A side wall 53b under the side wall upper portion 53a has a larger taper angle similar to FIG. 8B because of less reaction with the reaction gasses, and has an angle θ1 relative to the underlying surface where θ1>θ2.

The side wall upper portion of a conductive layer formed by the etching shown in FIG. 8C effectively improves the step coverage of a higher level layer formed thereon. Furthermore, since the side wall lower portion of the conductive layer has a larger taper angle, a region of a thin conductive layer is reduced so that even a narrow wiring pattern can realize a desired low resistance.

Figure 9:
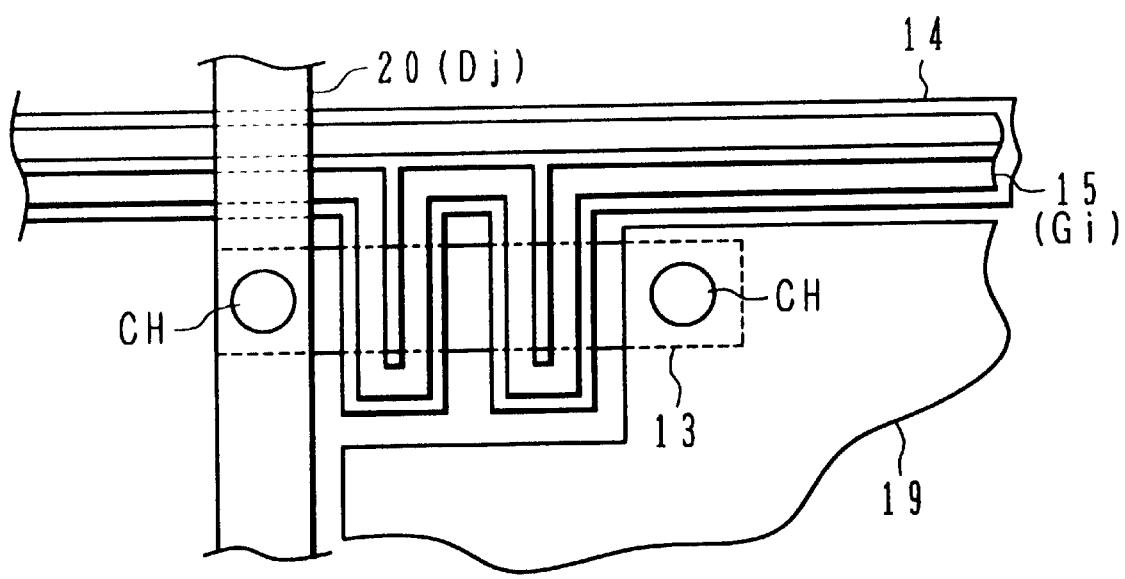
FIG. 9 is a plan view showing another structure of an active circuit of a liquid crystal display.

FIG. 9 is a schematic diagram showing the layout of a TFT having a dual gate. A semiconductor layer 13 is formed long in a lateral direction in FIG. 9, and two gates (dual gate) are formed at the middle area of the semiconductor layer 13. More specifically, after the semiconductor layer 13 is covered with a gate insulating film 14, an Al layer 15 serving as a gate electrode and a gate wiring pattern is formed on the gate insulating film 14. A resist pattern is formed on the Al layer 15. By using any one of the etching methods described above, the gate layer 15 and underlying gate insulating film 14 are patterned.

Two juxtaposed gate electrodes are therefore formed over the semiconductor layer 13. Thereafter, a drain wiring pattern 20(Dj) and a pixel electrode 19 are formed with an interlayer insulating films being interposed between the gate electrodes and the drain wiring pattern 20(Dj) and pixel electrode 19. The drain wiring pattern 20(Dj) and pixel electrode 19 are connected to the semiconductor layer 13 via contact holes CH.

In such a dual gate structure, two gates are juxtaposed over the semiconductor layer 13 to establish good off-state. It is also possible to form more than two gate structure in one TFT, to enhance good off-state. If the taper angle of the gate electrode is too small, the gate electrode width is required to be wide in order to lower the gate electrode resistance. This makes the size of TFT large and limits the area to be occupied by the pixel electrode 19. It is therefore desired that the taper angle of the gate electrode is larger than a certain value. From this viewpoint, if the side wall of the gate electrode is formed to have a constant taper angle, it is desired that the taper angle of the etched gate electrode is 20° or larger.

The liquid crystal display such as shown in FIG. 6A has one thin film transistor TFT per one pixel in the display area. For example, all TFT's are made of n-channel transistors. However, it is desired to form the gate driver GD, data driver DD, and other peripheral circuits by using complementary transistors formed on peripheral areas of the same glass substrate.

In forming CMOSFET's in a peripheral circuit, transistors of one conductivity type, e.g., n-channel TFT's, are formed by the same processes as those of forming switching transistors TFT's in the display area. Transistors of the other conductivity type are desired to be formed by co-using the same processes as many as possible.

FIGS. 10A to 10J are cross sectional views of a substrate illustrating a method of forming complementary TFT transistors.

Figure 10A:
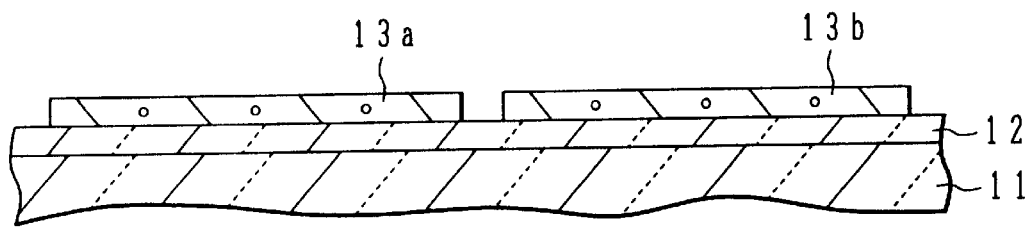
FIGS. 10A–10J are cross sectional views of a substrate illustrating a method of manufacturing complementary type TFTs according to another embodiment of the invention.

As shown in FIG. 10A, on the surface of a glass substrate 11 having a thickness of about 0.7 mm, a silicon oxide film 12 is deposited by PECVD, for example, to a thickness of about 200 nm. This silicon oxide film prevents diffusion of impurities in the glass substrate 11 into a higher level layer. On the silicon oxide film 12, an amorphous silicon film is formed by PECVD, for example, to a thickness of 50 nm. The amorphous silicon film may be patterned according to necessity by using a resist pattern to form island regions 13a and 13b of amorphous silicon.

The amorphous silicon film has some boron (13) concentration doped therein in order to control the threshold value of TFT. After this amorphous silicon film is subjected to dehydrogenation annealing, excimer laser is radiated to crystalize amorphous silicon. With this laser radiation, the amorphous silicon film is changed to a polycrystalline silicon film.

If the silicon layer is not patterned, island patterns 13a and 13b of the polysilicon film are formed through photolithography and etching of the polysilicon film. In this case, it is preferable to etch the polysilicon film so as to form slanted side walls and improve the step coverage of the upper layers.

Figure 10B:
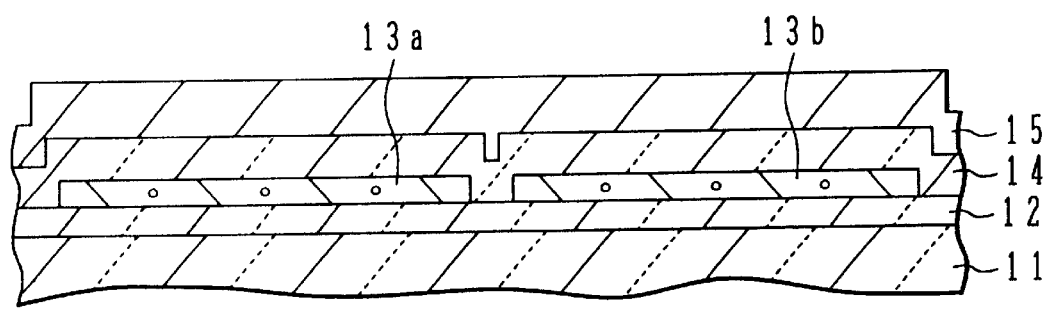

As shown in FIG. 10B, the surfaces of the patterned polysilicon films 13a and 13b are washed with aqueous solution of diluted hydrofluoric acid, and thereafter a silicon oxide film 14 as the gate insulating film is deposited by PECVD, for example, to a thickness of 120 nm. After the silicon oxide film 14 is annealed, a gate layer 15 is deposited to a thickness of about 300 nm by sputtering, the gate layer being made of Al alloy containing Nd of 2 at % to 5 at %. A thickness distribution of the gate layer 15 is, for example, about +/−10%.

Next, the substrate is dipped, for example, in 2.2% TMAH aqueous solution to perform a TMAH process. Then, the substrate is cleaned in water by ultrasonic cleaning of MHz order, and thereafter the surface of the substrate is dried. After these processes, photoresist is coated on the surface of the Al alloy layer 15, exposed and developed to form a resist pattern.

Figure 10C:
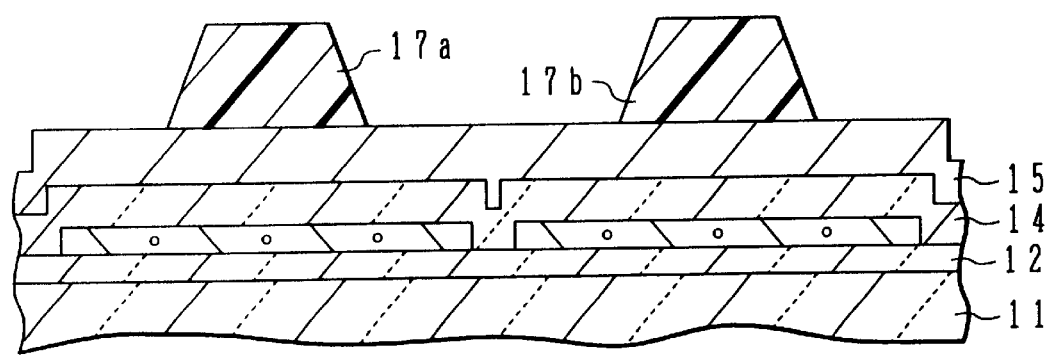

FIG. 10C shows the substrate after resist patterns 17a and 17b are formed. After the resist patterns are formed, the substrate is heated to a predetermined temperature to post-bake the resist patterns. The postbaking temperature is selected so as to provide a desired taper angle, for example, as in the characteristics of the postbaking temperature shown in FIG. 3. For example, the postbaking temperature is set to 100° C. to provide the taper angle of 35°.

Figure 10D:
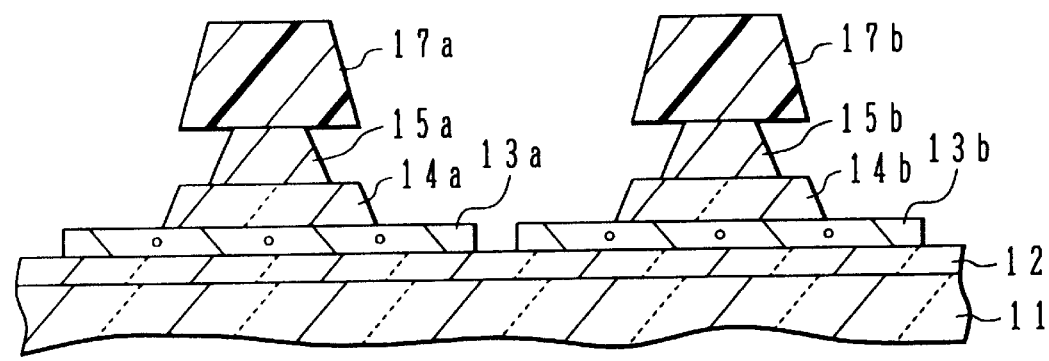

As shown in FIG. 10D, by using the resist patterns 17a and 17b as etching masks, the Al alloy layer 15 is etched with aqueous solution which contains phosphoric acid, nitric acid, and acetic acid. With this wet etching, the whole thickness of the exposed Al alloy layer 15 is etched and further side-etching (taper etching) is performed to etch the Al alloy layer 15 under the resist patterns 17a and 17b by an amount of 0.7 to 1.0 μm inside of the outer edges of the resist patterns. Since the postbaking temperature is set to 100° C., the side wall taper angle of the Al alloy layers 15a and 15b is about 35°.

The substrate is again subjected to after-baking at 100° C. Next, the gate insulating film 14 is etched by reactive ion etching (RIE). For example, the gate insulating film 14 is anisotropically etched by RIE using $CHF_3$ gas. By setting the etching conditions so that the side walls of the resist patterns 17a and 17b are gradually retracted, the side walls of the gate insulating films 14a and 14b are etched to have a forward taper angle.

Since the gate insulating films 14a and 14b are anisotropically etched by RIE, the shapes of the films are controlled by the shapes of the resist patterns 17a and 17b, and are larger than the shapes of the side-etched Al alloy layers 15a and 15b. The width of each wing region of the gate insulating films 14a and 14b extending outward from the lower ends of the Al alloy layers 15a and 15b is about 0.7 to 1.0 μm. The side walls of the gate insulating films 14a and 14b have a forward taper angle of, for example, about 60°.

Thereafter, the substrate is washed with water, and after light ashing is performed, the resist patterns 17a and 17b are removed by remover. The light ashing ashes by RIE a chemically changed layer formed on the surface of the resist layer. Washing with water before the light ashing is performed so as not to leave on the substrate surface fluorine containing gas ($CHF_3$) used during the dry etching process. If the fluorine gas remains resident, the gate insulating film and underlying polysilicon film may be etched during the light ashing.

Figure 10E:
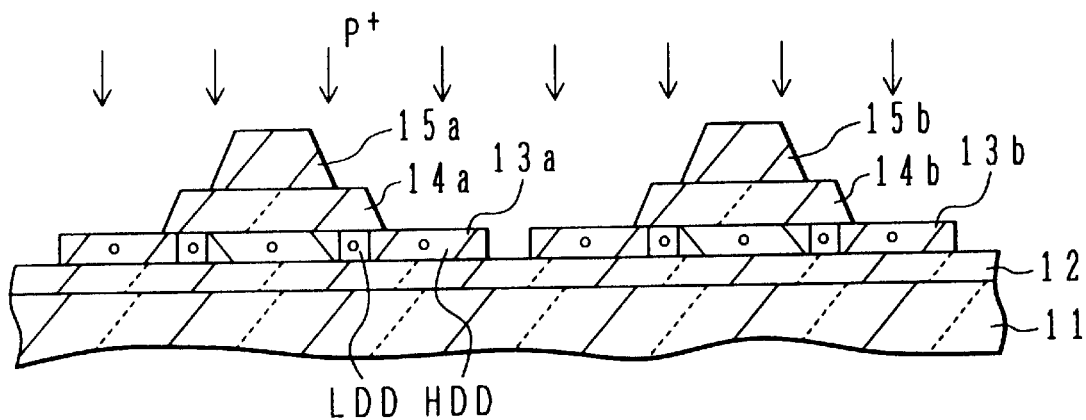

As shown in FIG. 10E, n-type impurity ions, e.g. phosphorus (P) ions, are doped from an upper position of the substrate by an ion doping method. For example, the ion doping conditions are to perform ion doping twice, e.g. by through doping and bare doping.

With the through doping, ions are implanted via the gate insulating films 14a and 14b into the underlying polysilicon films 13a and 13b. For example, under the conditions of an acceleration energy of 70 keV and a dose of $1\times10^{14}cm^{-2}$, the impurity concentration of the polysilicon layer under the gate insulating film becomes $1\times10^{19}cm^{-3}$.

The bare doping is executed, for example, under the conditions of an acceleration energy of 10 keV and a dose of $7.5\times10^{14}cm^{-2}$, so as to set the impurity concentration of the exposed polysilicon layer 13 to about $7.5\times10^{19}cm^{-3}$.

As above, the impurity concentration of each polysilicon layer region not covered with the gate insulating films 14a and 14b is set to at least a twofold, or more preferably a fivefold, of that of each polysilicon layer region covered with the gate insulating films and subjected to the through doping. With such two-step ion implantation, an LDD structure having LDD and HDD regions can be realized.

Figure 10F:
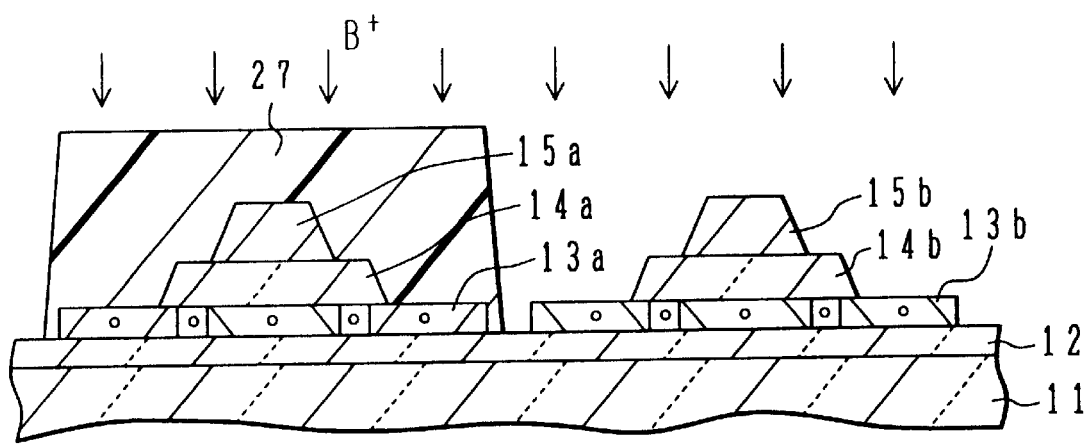

As shown in FIG. 10F, an area where n-channel transistors are formed is covered with a photoresist pattern 27. An area where p-channel transistors are formed is exposed outside of the photoresist pattern 27. In this state, boron (B) ions are doped by an ion doping method. Boron ions are doped at a higher impurity concentration than the phosphorous (P) ion concentration to compensate for the ion doped region and reverse the conductivity type. The HDD region implanted with boron ions changes its conductivity type from $n^+$-type to $p^+$-type, and the LDD region changes its conductivity type from $n^-$-type to $p^-$-type. When ions are doped in the process shown in FIG. 10E, the area where p-channel transistors are formed may be covered with a photoresist pattern. In this case, ion doping in the process shown in FIG. 10F is not required to consider compensation for the ion doping region.

In the above manner, n-channel TFT transistors are changed to p-type TFT transistors. Boron (B) ions may be doped by two-step ion doping described with reference to FIG. 10E or may be doped by a single ion doping. If ions are doped by a single ion doping, it is necessary to set the ion doping conditions so as to change the region under the gate insulating film 14b from $n^-$-type to $p^-$-type. Thereafter, the resist pattern 27 is ashed and removed, and then the substrate is washed with water.

Figure 10G:
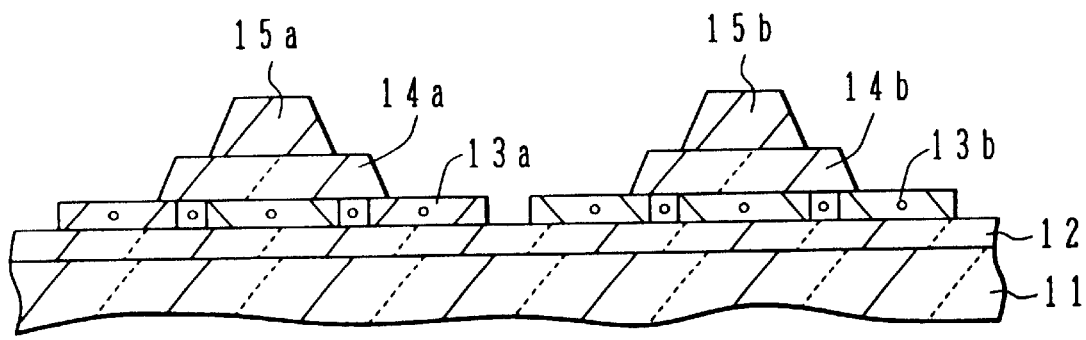

FIG. 10G shows complementary TFT transistors formed in the above manner. By using complementary TFT transistors, an inverter or the like of low power consumption can be formed. By forming complementary TFT transistors of the LDD structure, a semiconductor circuit can be realized which has short channel complementary TFT transistors capable of high speed operation and prevents a lowered drain breakdown voltage even during the on-period (unlikely to generate the short channel effects).

If ion doping is performed by a ion doping method of the type that mass is not separated, target impurities as well as a large amount of hydrogen atoms are doped in the ion doped region. In order to remove hydrogen atoms, dehydrogenation annealing is performed, for example, at 380° C. for about two hours.

The ion doped region is likely to be crystallized finely or become amorphous because of energy impact during the ion implantation. It is therefore preferable to perform an activation process using excimer laser. Instead of activating by using excimer laser, both activation by excimer laser and activation by rapid thermal annealing may be performed.

Figure 10H:
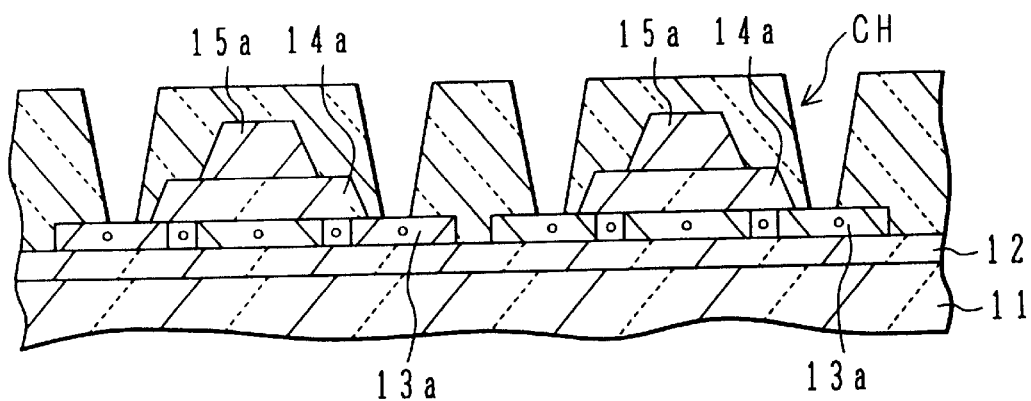

As shown in FIG. 10H, a silicon nitride film 16 as a first interlayer insulating film is deposited by PECVD over the whole surface of the substrate formed with complementary TFT transistors, for example, to a thickness of 400 nm. Thereafter, annealing is performed to improve the film quality. A resist pattern is formed on the silicon nitride film 16. Contact holes CH are formed through the silicon nitride film 16 by etching the latter.

Figure 10I:
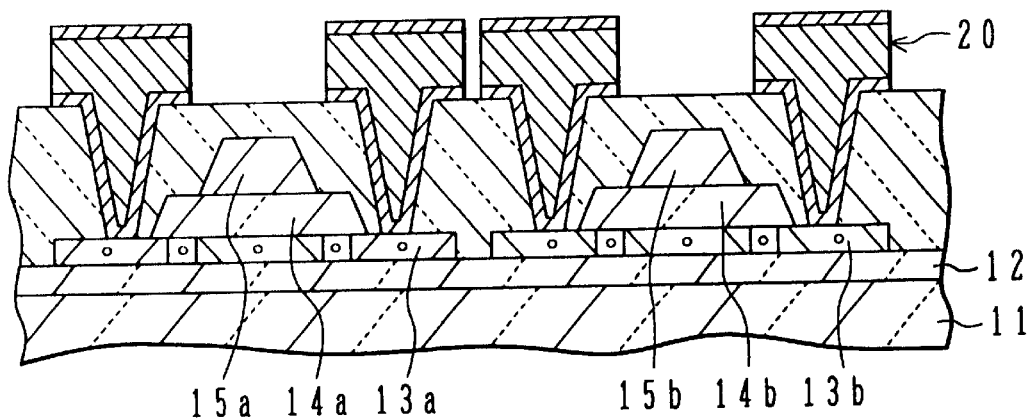

As shown in FIG. 10I, after the substrate surface is cleaned with diluted hydrofluoric acid aqueous solution, for example, a three-layer lamination structure made of a Ti film of about 100 nm thickness, an Al-Si alloy film of about 200 nm thickness, and a Ti film of about 100 nm thickness sequentially deposited in this order is formed. A resist pattern is formed on the three-layer lamination structure and a wiring layer 20 is formed by etching the three-layer lamination structure, the wiring layer 20 including source electrodes, drain electrodes, drain wiring patterns, and the like.

Figure 10J:
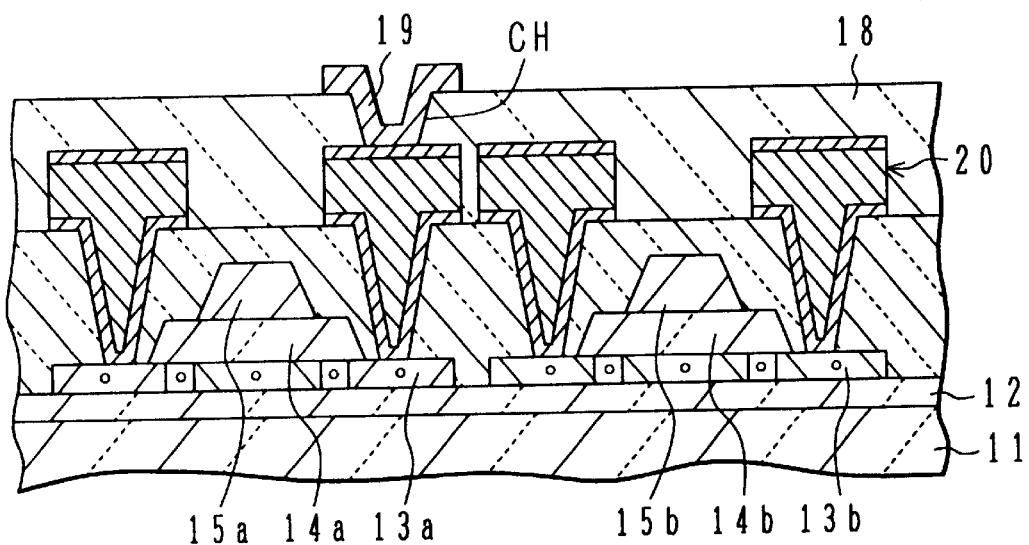

As shown in FIG. 10J, a silicon nitride film 18 as a second interlayer insulating film is deposited over the whole substrate surface. A resist pattern is formed on the silicon nitride film 18 through which a contact hole CH is formed by etching the silicon nitride film 18. An ITO film is formed on the interlayer insulating film 18 with the contact hole, and a pixel electrode 10 and an uppermost layer of an external terminal electrode are formed through photolithography and etching.

As the second interlayer insulating film, photsensitive transparent resin may be used and planarized. The reason for using the ITO film as the uppermost layer of an external terminal electrode is to improve the electrical connection characteristics. Lastly, for the recovery of the TFT characteristics, annealing is performed at 200° C for about one hour.

With the above method, a complementary TFT circuit can be formed on a glass substrate by using a smaller number of masks. By adopting the taper structure, the step coverage of a higher level layer can be improved and the manufacture yield can be improved.

The present invention has been described in connection with the preferred embodiments. The invention is not limited only to the above embodiments. It will be apparent to those skilled in the art that various modifications, improvements, combinations, and the like can be made.

What is claimed is:

1. A method of etching an Al or Al alloy layer, comprising the steps of:
   (a) forming an Al or Al alloy layer on an underlying surface;
   (b) processing a surface of the Al or Al alloy layer with tetramethylammonium hydroxide (TMAH);
   (c) forming a resist pattern on the surface of the Al or Al alloy layer processed with TMAH; and
   (d) wet-etching the Al or Al alloy layer, using the resist pattern as an etching mask.

2. A method of etching an Al or Al alloy layer according to claim 1, wherein said step (d) etches a whole thickness of the Al or Al alloy layer in a region where the resist pattern is not formed, and thereafter further taper-etches the Al or Al alloy layer under the resist pattern.

3. A method of etching an Al or Al alloy layer according to claim 2, wherein said step (c) includes a subsidiary step of coating a resist layer on the Al or Al alloy layer, a subsidiary step of selectively exposing the resist layer, a subsidiary step of developing the exposed resist layer to form the resist pattern, and a subsidiary step of postbaking the resist pattern.

4. A method of etching an Al or Al alloy layer according to claim 3, wherein said subsidiary step of postbaking the resist pattern heats the resist pattern to a temperature in a range from 60° C. to 140° C.

5. A method of etching an Al or Al alloy layer according to claim 2, further comprising a step (e) of anisotropically dry-etching the underlying surface by using the resist pattern as the etching mask.

6. A method of etching an Al or Al alloy layer, comprising the steps of:
   (a) forming an Al or Al alloy layer on an underlying surface;
   (b) removing a surface layer of changed property of the Al or Al alloy layer;
   (c) forming a resist pattern on a surface of the Al or Al alloy layer, after the step (b); and
   (d) wet-etching the Al or Al alloy layer, using the resist pattern as an etching mask.

7. A method of etching an Al or Al alloy layer according to claim 6, wherein said step (b) processes said surface layer of the Al or Al alloy layer with aqueous solution which contains tetramethylammonium hydroxide (TMAH), choline, ethylenediaminetetraacetic acid (EDTA), or diluted hydrofluoric acid.

8. An etching method comprising the steps of:
   (a) forming a metal layer on an underlying surface, the metal layer having a surface layer having a high etching rate;
   (b) processing a surface of the metal layer with TMAH; and
   (c) wet-etching the metal layer, using a resist pattern as an etching mask.

9. An etching method according to claim 8, wherein the metal layer is made of a first metal layer of Al or Al alloy and a second metal layer of Ti formed on the first metal layer.

10. A thin film transistor matrix substrate comprising:
    an insulating substrate having a flat surface;
    a plurality of island patterns made of semiconductor and formed on the flat surface of said insulating substrate;
    a gate insulating film formed traversing a central area of a flat surface of each of the plurality of island patterns; and
    a gate layer formed on a central surface area of said gate insulating film and exposing a wing of said gate insulating film on both sides thereof, said gate layer having side walls of a forward taper slanted relative to a normal to the flat surface of said insulating substrate and an upper surface generally perpendicular to the normal, and serving as a gate electrode and a gate wring pattern.

11. A method of manufacturing a thin film transistor matrix comprising the steps of:
    (a) forming a semiconductor layer on an insulating substrate;
    (b) forming a gate insulating film on the semiconductor layer;
    (c) forming a gate layer made of Al or Al alloy on the gate insulating film;
    (d) processing a surface of the gate layer with TMAH;
    (e) forming a resist pattern on the surface of the gate layer processed with TMAH;
    (f) wet-etching the gate layer, using the resist pattern as an etching mask, while the gate layer is formed with side walls of a forward taper; and (g) anisotropically dry-etching the gate insulating film by using the resist pattern as an etching mask.

12. A method of manufacturing a thin film transistor matrix according to claim 11, wherein said step (f) etches a whole thickness of the gate layer in a region where the resist pattern is not formed, and thereafter further taper-etches the gate layer under the resist pattern.

13. A method of manufacturing a thin film transistor matrix according to claim 12, wherein said step (e) forms a resist pattern having side walls of a forward taper, and said step (g) forms a pattern of the gate insulating film having side walls of a forward taper while the resist pattern is consumed.

14. A method of manufacturing a thin film transistor matrix according to claim 20, further comprising the steps of:
   (h) after said step (g), removing the resist pattern; and
   (i) after said step (h), implanting impurity ions into the semiconductor layer.

15. A method of manufacturing a thin film transistor matrix according to claim 14, wherein said step (i) includes a first ion implanting step of implanting impurity ions at an acceleration energy allowing the impurity ions to pass through the gate insulating film and be implanted into the semiconductor layer and a second ion implanting step of implanting impurity ions at an acceleration energy not allowing the impurity ions to pass through the gate insulating film.

16. A method of manufacturing a thin film transistor matrix according to claim 11, wherein said step (e) includes a subsidiary step of coating a resist layer on the surface of the gate layer, a subsidiary step of selectively exposing the resist layer, a subsidiary step of forming the resist pattern by developing the resist pattern, and a subsidiary step of postbaking the resist pattern.

17. A method of manufacturing a thin film transistor matrix according to claim 16, wherein said postbaking subsidiary step heats the resist pattern to a temperature in a range from 60° to 140°.

18. A method of manufacturing a thin film transistor matrix according to claim 11, wherein said step (f) uses aqueous solution which contains phosphoric acid and nitric acid.

19. A method of manufacturing a thin film transistor matrix comprising the steps of:
   (a) forming a semiconductor layer on an insulating substrate;
   (b) forming a gate insulating film on the semiconductor layer;
   (c) forming a first gate layer made of Al or Al alloy on the gate insulating film;
   (d) forming a second gate layer made of Ti on a surface of the first gate layer;
   (e) forming a resist pattern on a surface of the second gate layer;
   (f) wet-etching the first and second gate layers, using the resist pattern as an etching mask; and
   (g) anisotropically etching the gate insulating film by using the resist pattern as an etching mask.

20. A method of etching an Al or Al alloy member according to claim 6,
   wherein said surface layer comprises at least one of a natural oxide film and a natural hydrated film, and wherein said step (b) comprises the step of slightly etching said surface layer of the Al or Al alloy layer.

* * * * *

UNITED STATES PATENT AND TRADEMARK OFFICE
CERTIFICATE OF CORRECTION

PATENT NO.     : 6,335,290 B1
DATED          : January 1, 2002
INVENTOR(S)    : Ishida It is certified that error appears in the above-identified patent and that said Letters Patent is hereby corrected as shown below:

<u>Column 17,</u>
Line 15, delete "20" and insert -- 11 -- therefor.

Signed and Sealed this

Ninth Day of July, 2002

Attest:

Attesting Officer

JAMES E. ROGAN
*Director of the United States Patent and Trademark Office*